US010748999B2

(12) United States Patent
Cook et al.

(10) Patent No.: US 10,748,999 B2
(45) Date of Patent: Aug. 18, 2020

(54) MULTI-SUPER LATTICE FOR SWITCHABLE ARRAYS

(71) Applicant: TEXAS INSTRUMENTS INCORPORATED, Dallas, TX (US)

(72) Inventors: Benjamin Stassen Cook, Addison, TX (US); Luigi Colombo, Dallas, TX (US); Nazila Dadvand, Richardson, TX (US); Archana Venugopal, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/229,827

(22) Filed: Dec. 21, 2018

(65) Prior Publication Data

US 2020/0203483 A1    Jun. 25, 2020

(51) Int. Cl.
*H01L 29/15* (2006.01)
*H01L 29/16* (2006.01)
*H01L 29/423* (2006.01)
*H01L 29/808* (2006.01)
*H01L 29/66* (2006.01)

(52) U.S. Cl.
CPC ........ *H01L 29/151* (2013.01); *H01L 29/1606* (2013.01); *H01L 29/42316* (2013.01); *H01L 29/808* (2013.01); *H01L 29/66045* (2013.01)

(58) Field of Classification Search
CPC ........... H01L 29/1606; H01L 29/66045; H01L 29/151; H01L 29/808; H01L 29/42316
See application file for complete search history.

(56) References Cited

U.S. PATENT DOCUMENTS

| | | | |
|---|---|---|---|
| 2012/0261673 A1* | 10/2012 | Schulze | H01L 29/1606 257/77 |
| 2013/0189444 A1* | 7/2013 | Kub | B82Y 30/00 427/523 |
| 2013/0230722 A1 | 9/2013 | Fujii et al. | |
| 2014/0140647 A1 | 5/2014 | Saxton | |
| 2015/0176132 A1 | 6/2015 | Hundley et al. | |
| 2017/0082569 A1 | 3/2017 | Sommer et al. | |
| 2017/0278930 A1* | 9/2017 | Ruhl | H01L 21/76251 |
| 2019/0013386 A1* | 1/2019 | Shinohara | H01L 29/7786 |

FOREIGN PATENT DOCUMENTS

| | | |
|---|---|---|
| RU | 2577273 C1 | 3/2016 |
| WO | 2016080910 A1 | 5/2016 |

OTHER PUBLICATIONS

International Search Report for PCT/US2018/067997 dated Apr. 4, 2019.
International Search Report for PCT/US2018/068171 dated Apr. 18, 2019.

(Continued)

*Primary Examiner* — Changhyun Yi
(74) *Attorney, Agent, or Firm* — Michael A. Davis, Jr.; Charles A. Brill; Frank D. Cimino

(57) ABSTRACT

A switchable array micro-lattice comprises a plurality of interconnected units wherein the units are formed of graphene tubes. JFET gates are provided in selected members of the micro-lattice. Gate connectors are routed from an external surface of an integrated circuit (IC) through openings in the micro-lattice to permit control of the JFET gates.

20 Claims, 14 Drawing Sheets

(56) References Cited

OTHER PUBLICATIONS

Xiaoyu Zheng et. al., Ultralight, Ultrastiff Mechanical Metamaterials; Science 344 (2014) 1373-1377.
T. A. Schaedler, et al., Ultralight Metallic Microlattices; Science 334 (2011) 962-965.
Y. T. Liang, et al., Towards Rationally Designed Graphene-Based Materials and Devices, Macromol. Chem. Phys. 213 (2012) 1091-1100.

\* cited by examiner

MULTI-SUPER LATTICE FOR SWITCHABLE ARRAYS

CROSS-REFERENCE TO RELATED APPLICATIONS

This application is related to the application Ser. No. 16/229,668 entitled "$sp^2$-Bonded Carbon Structures" and filed concurrently herewith which claims priority to U.S. Provisional Patent Application No. 62/611,347 filed on Dec. 28, 2017, and to the application Ser. No. 16/229,822 entitled "Multi-layered $sp^2$-Bonded Carbon Tubes" and filed concurrently herewith which claims priority to U.S. Provisional Patent Application No. 62/611,483 filed on Dec. 28, 2017, and to the application Ser. No. 16/230,070 entitled "Hexagonal Boron Nitride Structures" and filed concurrently herewith which claims priority to U.S. Provisional Patent Application No. 62/611,499 filed on Dec. 28, 2017, and to the application Ser. No. 16/229,971 entitled "Filler Particles For Polymers" and filed concurrently herewith which claims priority to U.S. Provisional Patent Application No. 62/611,511 filed on Dec. 28, 2017, and to the application Ser. No. 16/230,045 entitled "Gas Sensor With Superlattice Structure" and having filed concurrently herewith which claims priority to U.S. Provisional Patent Application No. 62/611,554 filed on Dec. 29, 2017, the contents of which are hereby incorporated by reference in their entireties.

FEDERALLY SPONSORED RESEARCH OR DEVELOPMENT

Not Applicable

BACKGROUND

Graphene is a single-layer $sp^2$-hybridized 2D network of carbon atoms that serves as the basis of many allotropes of carbon. It can be stacked to form 3D graphite, rolled to form 1D carbon nanotubes, and fused to form 0D fullerenes. Owing to its strongly delocalized electron configuration, graphene exhibits exceptional charge carrier mobility, thermal conductivity, mechanical strength, and chemical stability. However, like other nanomaterials, the properties of graphene are dependent on its dimensions, physical environment, and integration schemes. Graphene and graphene-based materials have tailorable properties that can be exploited in a broad range of devices, including transistors, capacitors, electron field emitters, transparent conductors, sensors, catalysts, and drug delivery agents. Other 2D crystals, most notably boron nitride and molybdenum disulfide, have also been isolated.

Two-dimensional (2D) $sp^2$-bonded carbon exists in the form of graphene, buckyballs and carbon nanotubes (CNTs). Graphene is "flat" or 2D, fullerenes ("Buckyballs") are spherical or 0D, and CNTs are tubes in 1D. Forming these materials in a singular, regular, repeatable structure has not previously been achieved. Superstructures of these materials may provide very strong, light, highly thermally and electrically conductive structures. Attempts have been made to fabricate $sp^2$-bonded sponges, however these structures are irregular with properties that vary with position.

The isolation of graphene via the mechanical exfoliation of graphite has sparked strong interest in two-dimensional (2D) layered materials. The properties of graphene include exceptional strength, and high electrical and thermal conductivity, while being lightweight, flexible and transparent. This opens the possibility of a wide range of potential applications, including high-speed transistors and sensors, barrier materials, solar cells, batteries, and composites.

Other classes of 2D materials of interest include transition metal dichalcogenide (TMDC) materials, hexagonal boron nitride (h-BN), as well as those based on Group 14 elements, such as silicene and germanene. The properties of these materials can range from semi-metallic, for example, $NiTe_2$ and $VSe_2$, to semiconducting, for example, $WSe_2$ and $MoS_2$, to insulating, for example, hexagonal boron nitride (h-BN).

Growth of regular 3D superstructures using $sp^2$-bonded carbon may address the shortcomings of the flexible $sp^2$ carbons for 3D applications given that hexagonally arranged carbon is strong, chemically inert, electrically and thermally conductive, and optically transparent. Such 3D superstructures may find used in a number of applications from packaging, thin optically transparent electrically conductive strong thin films, and many more.

When a carbon atom is attached to three groups (or, as in the case of graphene, three other carbon atoms) via three a bonds, it requires three orbitals in the hybrid set. This requires $sp^2$ hybridization.

An $sp^2$-hybridized bond has 33% s and 67% p character. The three $sp^2$ hybrid orbitals point towards the corners of a triangle at 120° to each other. Each $sp^2$ hybrid is involved in a σ bond. The remaining p orbital forms the π bond. A carbon double bond may be viewed as a σ+π bond.

A three-dimensional integrated circuit (3D IC) is an integrated circuit manufactured by stacking silicon wafers or dies and interconnecting them vertically using, for instance, through-silicon vias (TSVs) or Cu—Cu connections, so that they behave as a single device to achieve performance improvements at reduced power and smaller footprint than conventional two-dimensional processes. A multi-layer or super lattice structure such as is disclosed herein may be used to create a switchable array in a 3D IC.

The junction gate field-effect transistor (JFET) is the simplest type of field-effect transistor. They are three-terminal semiconductor devices that can be used as electronically-controlled switches, amplifiers, or voltage-controlled resistors.

Unlike bipolar transistors, JFETs are exclusively voltage-controlled in that they do not need a biasing current. Electric charge flows through a semiconducting channel between source and drain terminals and by applying a reverse bias voltage to a gate terminal, the channel is "pinched", so that the electric current is impeded or switched off completely. A JFET is usually on when there is no potential difference between its gate and source terminals. If a potential difference of the proper polarity is applied between its gate and source terminals, the JFET will be more resistive to current flow, which means less current would flow in the channel between the source and drain terminals. Thus, JFETs are sometimes referred to as depletion-mode devices.

JFETs can have an n-type or p-type channel. For n-type devices, if the voltage applied to the gate is less than that applied to the source, the current will be reduced (similarly for p-type devices, if the voltage applied to the gate is greater than that applied to the source). A JFET has a large input impedance (sometimes on the order of $10^{10}$ ohms), which means that it has a negligible effect on external components or circuits connected to its gate.

The JFET is a long channel of semiconductor material, doped to contain an abundance of positive charge carriers or holes (p-type), or of negative carriers or electrons (n-type). Ohmic contacts are formed at the source (S) and the drain (D). A p-n-junction is formed on one or both sides of the channel, or surrounding it, using a region with doping opposite to that of the channel, and biased using an ohmic gate contact (G).

BRIEF SUMMARY

In one example, a switchable array micro-lattice comprises a plurality of interconnected units wherein the units are formed of graphene tubes. The graphene tubes that form the micro-lattice are arranged in an ordered structure and form symmetric patterns that repeat along the principal directions of three-dimensional space. JFET gates are provided in selected members of the micro-lattice. Gate connectors are routed from an external surface of an integrated circuit (IC) through openings in the micro-lattice to provide control of the JFET gates.

A method of forming a graphene microstructure of tubular members is disclosed herein which comprises: photo-initiating the polymerization of a monomer in a pattern of interconnected units to form a polymer micro-lattice; removing unpolymerized monomer; coating the polymer micro-lattice with a metal; removing the polymer micro-lattice to leave a metal micro-lattice; forming graphene on the metal micro-lattice; and selectively removing the metal micro-lattice.

BRIEF DESCRIPTION OF THE SEVERAL VIEWS OF THE DRAWING(S)

DETAILED DESCRIPTION

Figure 1A:
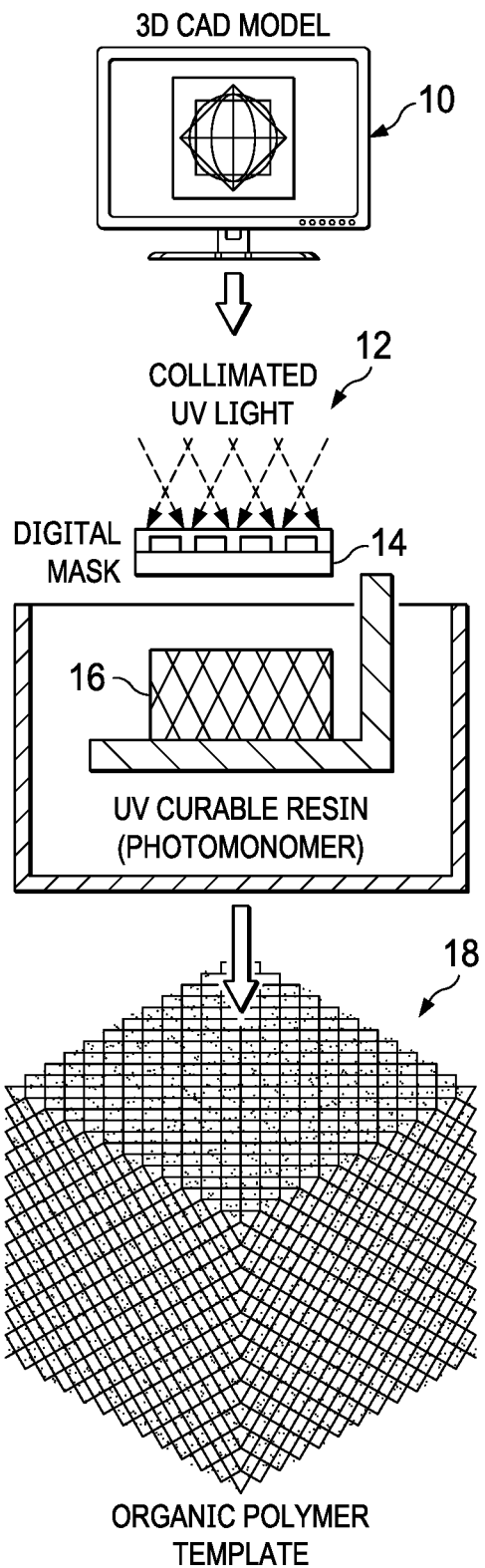
FIG. 1A is a schematic drawing of a fabrication process for a metal-based micro-lattice template in accordance with an example.

It has been found that an organic/inorganic superstructure may be used as a template for the formation of a 3D metal superstructure that may then be used to grow graphitic carbon on the surface of the metal. The template may be fabricated through a self-propagating photopolymer waveguide technique (see, e.g., Xiaoyu Zheng et. al., Ultralight, Ultrastiff Mechanical Metamaterials; *Science* 344 (2014) 1373-1377 and T. A. Schaedler, et al., Ultralight Metallic Micro-lattices; *Science* 334 (2011) 962-965). As illustrated schematically in FIG. 1A an interconnected 3D photopolymer lattice may be produced upon exposure of an appropriate liquid photomonomer 16 to collimated UV light 12 through a specifically designed e.g. using a computer-aided design model 10) digital mask 14 that contains openings with certain spacing and size. The fabricated organic polymer template micro-lattice 18 may then be coated by electroless copper or other suitable metal (e.g. Ni, Co, Au, Ag, and alloys thereof) followed by etching away the organic polymeric matrix (scaffold). The resulting metal-based micro-lattice may be treated with oxygen to minimize agglomeration and then used as a template to grow graphene. The light surface oxidation may also act as a source of oxygen to increase the dehydrogenation of the hydrocarbon precursors. The thickness of the electroless plated metal may be controlled in the nanometer to micrometer range by adjusting the plating time, temperature, and/or plating chemistry.

FIG. 1A schematically illustrates an exemplary fabrication process of organic polymeric micro-lattices (scaffolds) 18 prior to coating with electroless plating.

The present disclosure comprises a "periodically structured" carbon nanostructure. The carbon nanostructures of the prior art are irregular and have much larger dimensions than those which may be achieved using the methodology disclosed herein.

The present process may be used to create a regular array with superstructure dimensions (unit) and structure that may be optimized for strength, thermal and other fundamental properties.

There are several aspects of this procedure that are noteworthy:
- it provides a regular structure with specific defined dimensions;
- it can form very thin metal (e.g. Ni, Co, Ru, Cu, Ag, Au, and alloys thereof) micro-lattices;
- it enables the formation of graphitic carbon on very thin metals and thin metal wires or tubes.

The present process uses a polymeric structure as a template for such fabrication with the subsequent formation of a metal superstructure that may then be exposed to a hydrocarbon (e.g. methane, ethylene, acetylene, benzene) to form graphene, followed by etching of the metal from under the resulting graphene microstructure using appropriate etchants such as, for example, $FeCl_3$ or potassium permanganate.

Collimated UV light 12 through a photomask 14 or multi-photon lithography may be used in a photo-initiated polymerization process to produce a polymer micro-lattice 18 comprised of a plurality of interconnected units. Exemplary polymers include polystyrene and poly(methyl methacrylate) (PMMA). Once polymerized in the desired pattern, the remaining un-polymerized monomer may be removed.

The polymer structure (polymer scaffold) may then be plated with a suitable metal using an electroless plating process.

Electroless nickel plating (EN) is an auto-catalytic chemical technique that may be used to deposit a layer of nickel-phosphorus or nickel-boron alloy on a solid workpiece, such as metal, plastic, or ceramic. The process relies on the presence of a reducing agent, for example hydrated sodium hypophosphite ($NaPO_2H_2.H_2O$) which reacts with the metal ions to deposit the metal. Alloys with different percentages of phosphorus, ranging from 2-5 weight percent (low phosphorus) to up to 11-14 weight percent (high phosphorus) are possible. The metallurgical properties of the alloys depend on the percentage of phosphorus.

Electroless plating has several advantages over electroplating. Free from flux-density and power supply issues, it provides an even deposit regardless of workpiece geometry, and with the proper pre-plate catalyst, may be used to deposit metals on non-conductive surfaces. In contrast, electroplating can only be performed on electrically conductive substrates.

Before performing electroless plating, the material to be plated must be cleaned by a series of chemicals; this is known as a pre-treatment process. Failure to remove surface contaminants may result in poor plating. Each chemical pre-treatment must be followed by water rinsing (normally two to three times) to remove residual chemicals that may adhere to the surface. For example, de-greasing chemicals can be used to remove oils from surfaces, whereas acid cleaning is used to remove metal oxides.

Activation may be done with an immersion into a sensitizer/activator solution—for example, a mixture of palladium chloride, tin chloride, and hydrochloric acid.

The pre-treatment required for the deposition of metals on a non-conductive surface usually consists of an initial surface treatment to render the substrate hydrophilic. Following this initial step, the surface may be activated by a solution of a noble metal, e.g., palladium chloride. The substrate is then ready for electroless deposition.

The electroless plating reaction is accomplished when hydrogen is released by a reducing agent, normally sodium hypophosphite (with the hydrogen leaving as a hydride ion) or thiourea, and oxidized, thus producing a negative charge on the surface of the part. The most common electroless plating method is electroless nickel plating, although silver, gold and copper layers can also be applied in this manner.

In principle, any hydrogen-based reducing agent can be used although the redox potential of the reducing half-cell must be high enough to overcome the energy barriers inherent in liquid chemistry. Electroless nickel plating most often employs hypophosphite as the reducer while plating of other metals like silver, gold and copper typically makes use of low-molecular-weight aldehydes.

A benefit of this approach is that the technique can be used to plate diverse shapes and types of surfaces.

Figure 1B:
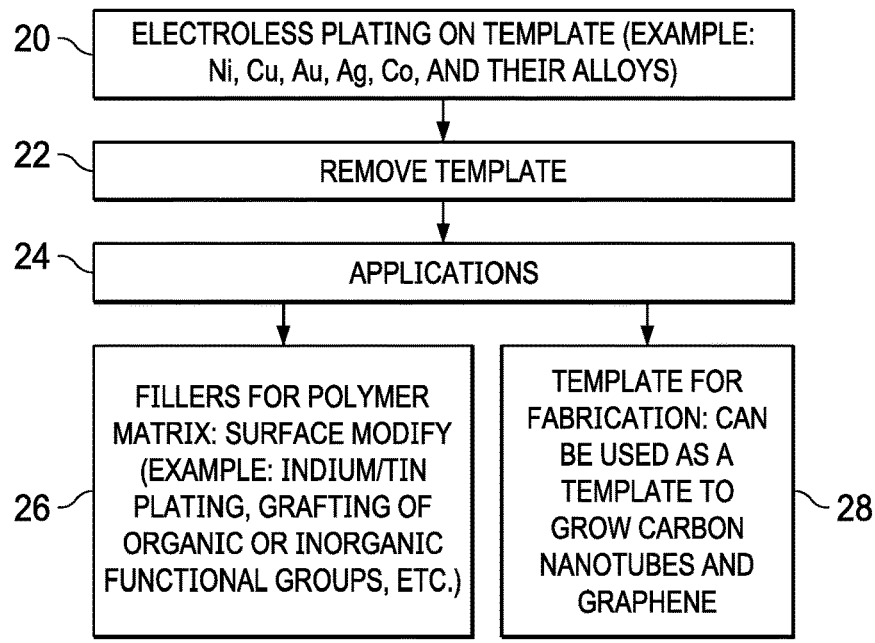
FIG. 1B is a flowchart of the fabrication process depicted schematically in FIG. 1A.
Figure 2:
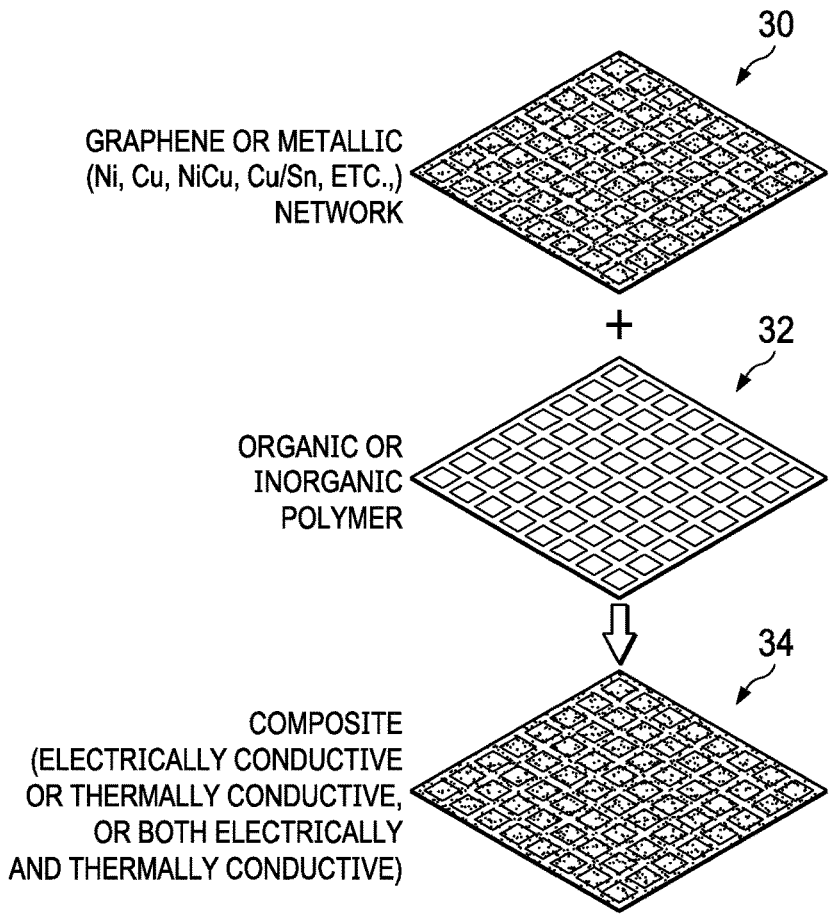
FIG. 2 is a schematic diagram of the fabrication of an electrically, thermally, or both thermally and electrically conductive composite by embedding a fabricated metal-based or graphene-based micro-lattice within an organic polymer matrix.

As illustrated in FIG. 1B, the organic polymeric microlattice may be electrolessly plated 20 with metal followed by dissolving out 22 the organic polymer scaffold. The resulting metal-based micro-lattice may be used in several applications 24—e.g. it may then be coated with a thin layer of immersion tin to prevent the metal from oxidizing during subsequent processing steps which may include a heat treatment. Alternatively, the surface of the metal-based micro-lattice may be functionalized with appropriate functional groups 26 in order to provide anchoring or reactions sites for subsequent interaction with a polymer matrix. The fabricated and surface-treated metallic network 30 may be embedded within an organic polymeric matrix 32 to fabricate electrically and/or thermally conductive composites 34 (see FIG. 2). Alternatively, the fabricated metallic network 30 may be used as a template 28 to synthesize a graphitic carbon superstructure. The metal may then be etched out to produce a graphene microstructure comprising a plurality of interconnected units wherein the units are formed of graphene tubes that are connected to other graphene tubes while still maintaining the $sp^2$-bonded nature.

Figure 3:
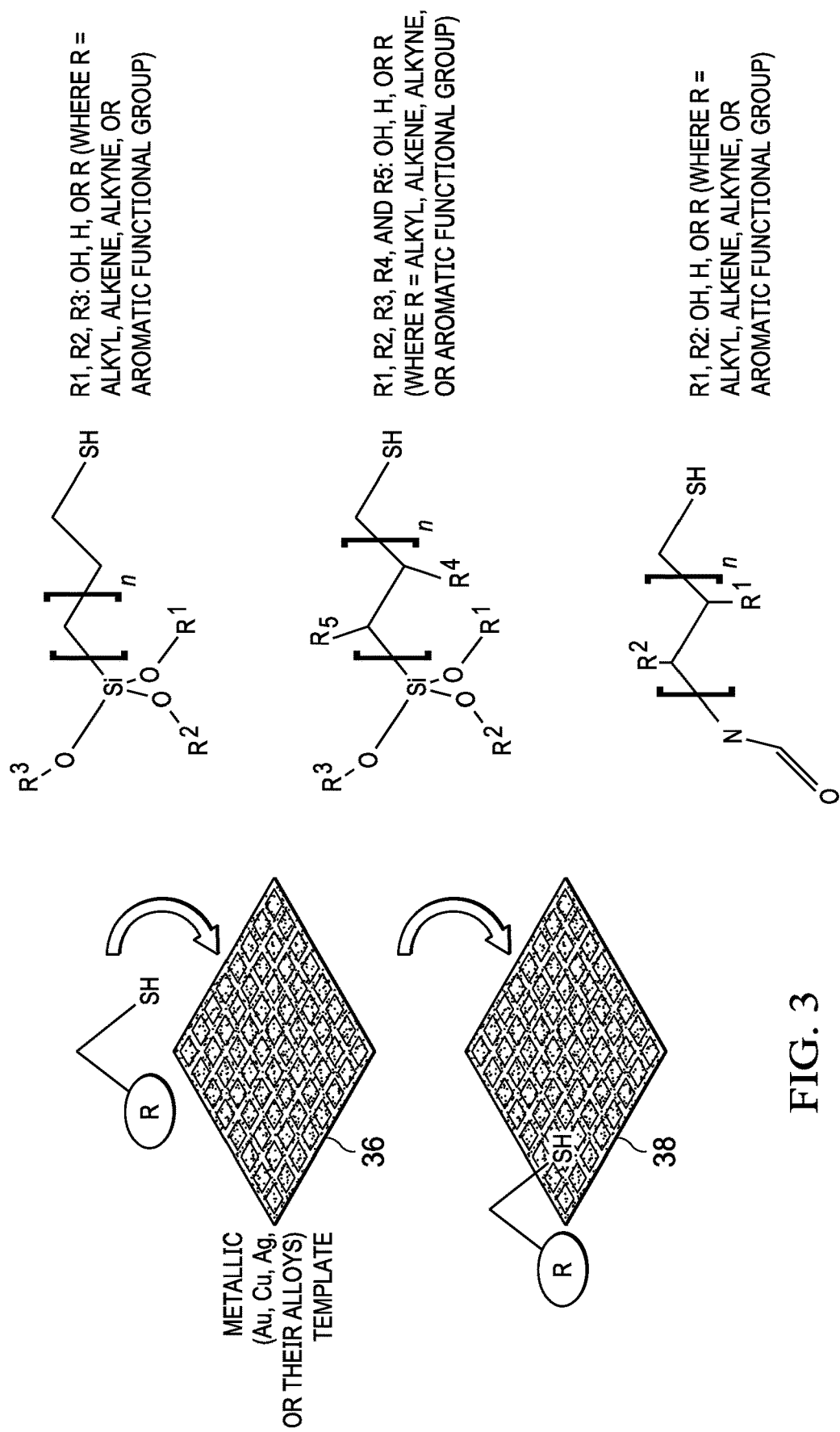
FIG. 3 is a schematic diagram of a surface functionalization methodology for functionalizing a fabricated metal-based micro-lattice.

FIG. 3 schematically illustrates a surface treatment methodology for functionalizing the fabricated metal-based micro-lattice. As can be seen from the figure, the surface of the metal micro-lattice 36 may be exposed to a mercaptan-based compound. The mercaptan-based compound may be a hydroxylated alkyl mercaptan such as 3-mercapto-1,2 dihydroxy propane or it may be based on an isocyanate function group such as isocyanate alkyl trialkoxy silane. The mercaptan-based compound bonds to the metal (such as e.g. copper, silver or gold) through the sulfur atom of the mercapto moiety resulting in a hydroxylated metal surface 38. The hydroxyl functional groups grafted on the metal surface may then react with a reactive functional group from the pre-polymer matrix. In the case of isocyanate-based mercaptan compounds, the free isocyanate functional groups may subsequently be reacted with certain functional groups of the organic polymeric matrix such as —OH, —NH, etc. resulting in the formation of chemical bonds at the copper-organic polymer interface. The polymer for the composite may be selected for its mechanical properties and/or electronic properties. Exemplary polymers include fluorocarbons (such as polytetrafluoroethylene) and polybutadiene.

In an example, the growth of graphene on the metal tubes may be omitted in order to produce a microlattice of interconnected metal tubes. A process for forming such a metal microstructure may comprise: photo-initiating the polymerization of a monomer in a pattern of interconnected units to form a polymer micro-lattice; removing unpolymerized monomer; coating the polymer micro-lattice with a metal; and removing the polymer micro-lattice to leave a micro-lattice of interconnected metal tubes in a pattern of interconnected units.

In another example, a metal/graphene microstructure of graphene-coated metal tubes in a pattern of interconnected units which may be prepared by the process comprising the steps of: photo-initiating the polymerization of a monomer in a pattern of interconnected units to form a polymer micro-lattice; removing unpolymerized monomer; coating the polymer micro-lattice with a metal; removing the polymer micro-lattice to leave a metal micro-lattice; and forming graphene on the metal micro-lattice.

As illustrated in FIGS. 4-15, the micro-lattice may form a switched array of connections. Among graphene's uncommon properties is its high electrical conductivity. This property makes the material attractive for many applications, but the lack of a bandgap makes it difficult to use for high-performance transistors due to its low $I_{on}/I_{off}$.

Various methods are known to introduce a bandgap into graphene—e.g. by fabricating graphene in specific shapes (like ribbons), or by forming bi-layers of graphene. Further, other 2D materials such as transition metal dichalcogenides, boron-carbon-nitride, or graphene-oxide, -hydride or -fluoride, can form films with a bandgap, and thus can be used instead of or together with graphene.

Referring now to FIGS. 4-9, a method for fabricating micro-lattices of graphene/carbon nanotubes suitable for use in switchable arrays comprises: a) patterning a graphene/carbon nanotube micro-lattice; b) patterning gates at selected locations in the micro-lattice; and, c) patterning a control-line "superlattice" for controlling the gates.

Figure 4:
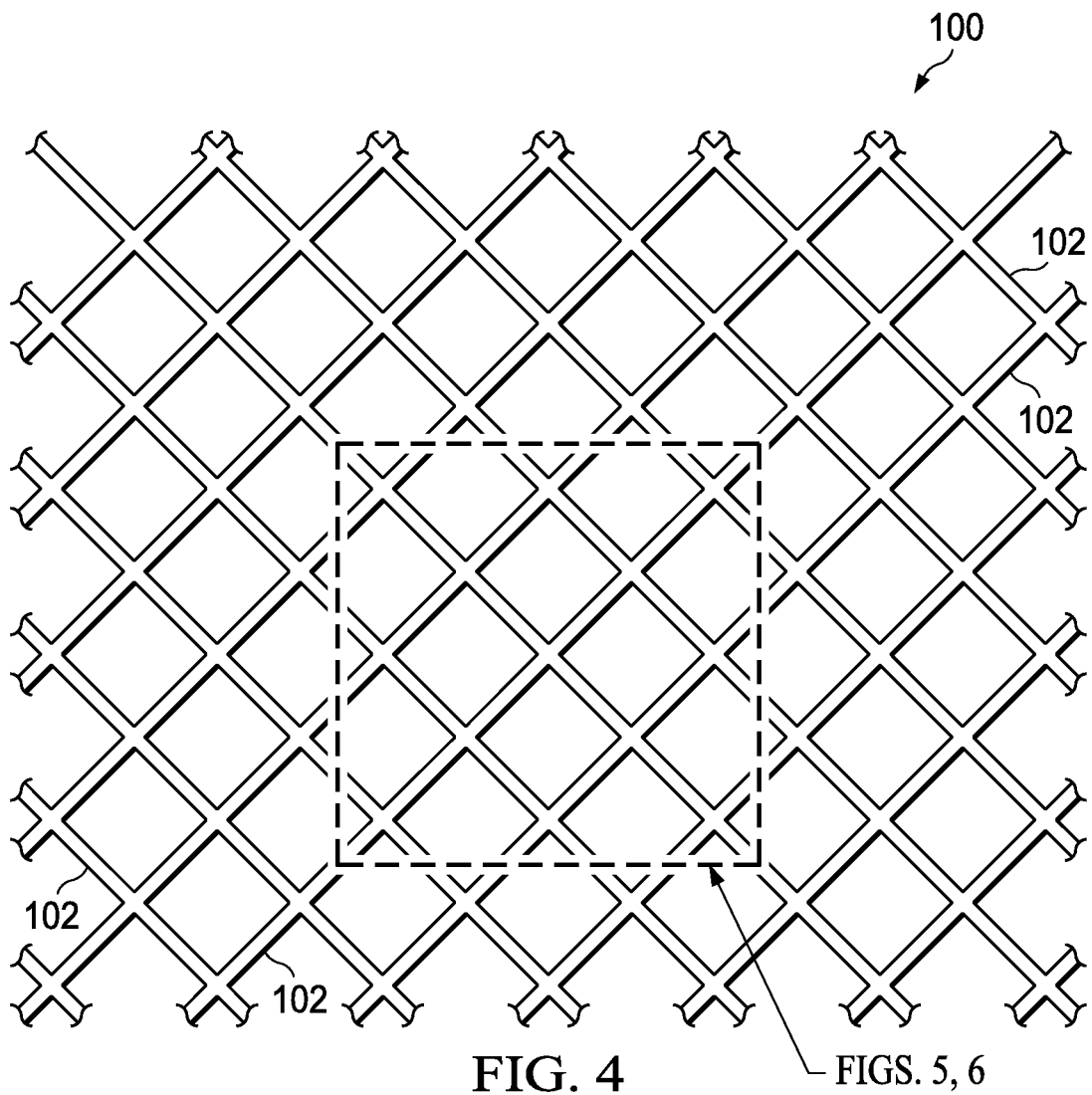
FIG. 4 is a 2D schematic representation of a graphene or graphene/polymer micro-lattice.

The following reference numbers are used in the drawing figures:
- 10 CAD design model
- 12 collimated UV light
- 14 digital mask
- 16 photomonomer
- 18 organic polymer template
- 20 electroless plating on template
- 22 removal of template
- 24 applications
- 26 fillers for polymer matrix application
- 28 template to grow carbon nanotubes and graphene application
- 30 graphene or metallic network
- 32 organic or inorganic polymer
- 34 composite
- 36 metallic template
- 38 hydroxylated metal surface
- 100 graphene/cnt superlattice
- 102 interconnected lattice members
- 104 polymer surrounding connections
- 106 dielectric and metal coating (on 102)
- 108 central void
- 110 graphene
- 112 insulator
- 114 metal
- 116 gate
- 118 external gate contact
- 120 polymer surrounding gate
- 122 metal
- 124 external surface of superlattice
- 126 connection
- 128 opening in lattice
- 130 gate
- 132 gate connector FIG. 4 schematically illustrates a graphene or graphene/polymer micro-lattice 100 comprised of interconnected units of orthogonal, interconnected members 102 as viewed from the top or side of the micro-lattice made up of graphene/polymer or graphene interconnected tubes. This stage of the process is through the graphene/polymer etch step. The portion indicated at "A" is further illustrated in FIGS. 5-9. Such a graphene or graphene/polymer micro-lattice may be fabricated by the method described above which involves a photo-initiated polymerization using multi-photon lithography or collimated light through a photomask.

Figure 5:
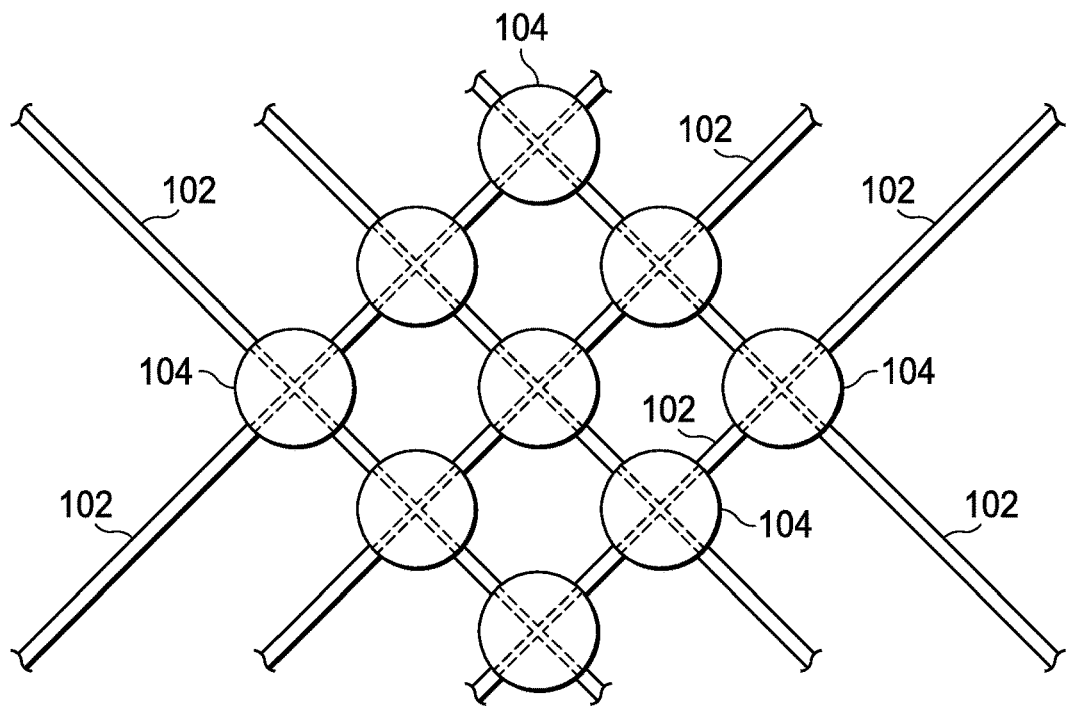
FIG. 5 is a 2D schematic representation of the graphene or graphene/polymer micro-lattice depicted in FIG. 4 with polymer applied around the connections between the micro-lattice members.

In FIG. 5, polymer 104 has been applied around the connections between the members 102 of the graphene or graphene/polymer micro-lattice 100 depicted in FIG. 4. This may be accomplished by immersing the micro-lattice in additional monomer and sending in a wider beam of light to photo-initiate polymerization around the connections.

Figure 6:
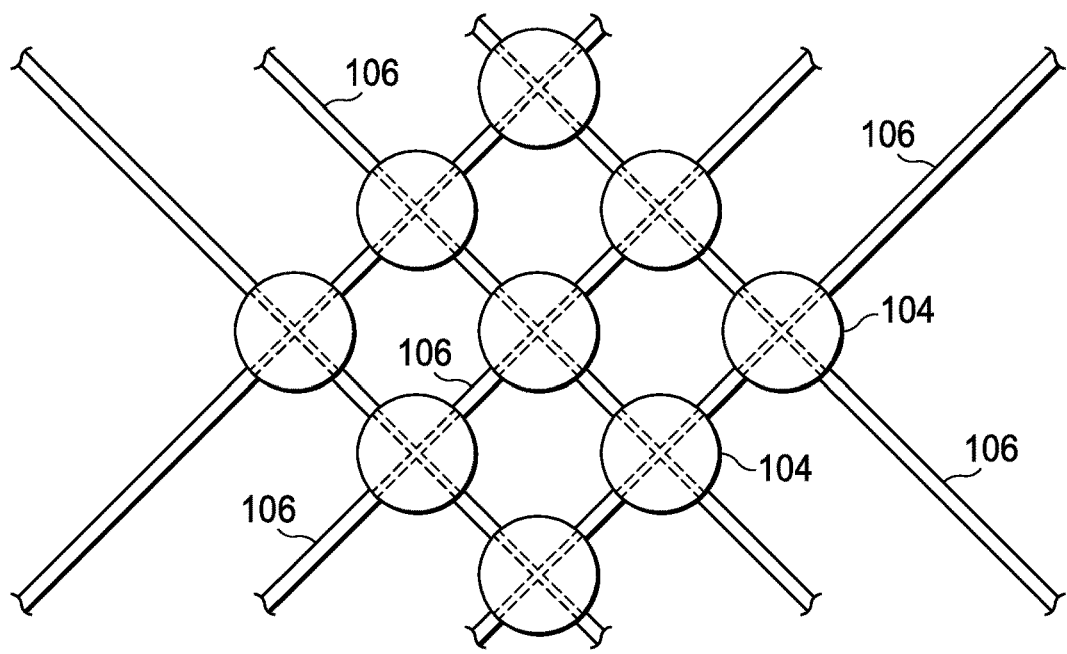
FIG. 6 is a 2D schematic representation of the graphene or graphene/polymer micro-lattice depicted in FIG. 5 with the micro-lattice members coated with dielectric and metal in the portions not having polymer applied around the connections.

In FIG. 6, portions of the micro-lattice members 102 not covered by the polymer applied around the connections between them have been coated with dielectric and metal 106.

Figure 7A:
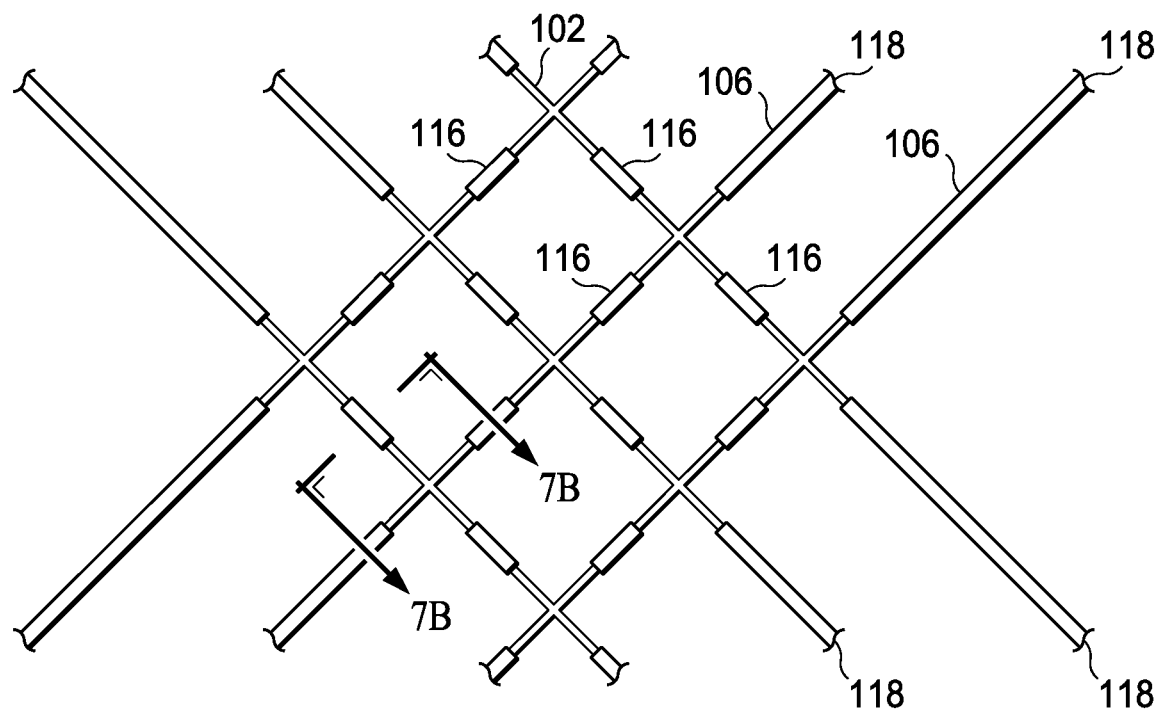
FIG. 7A is a 2D schematic representation of the graphene or graphene/polymer micro-lattice depicted in FIG. 6 with the plating resist removed, leaving gates.
Figure 7B:
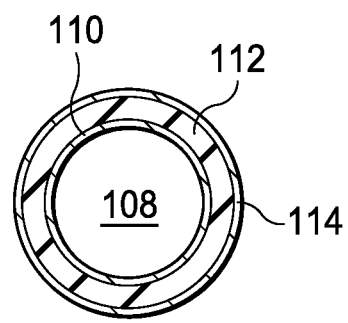
FIG. 7B is a cross-sectional view of the graphene or graphene/polymer micro-lattice shown in FIG. 7A taken along line 7B-7B.

In FIG. 7, the plating resist has been removed, leaving gates 116. A cross-sectional view of the gate is shown on the left of FIG. 7 wherein 108 is the central void space left when the polymer is removed, 110 is the resulting graphene tube, 112 is a dielectric insulator layer, and 114 is the metal coating. Electrical contacts 118 may extend to an edge of the die.

Figure 8A:
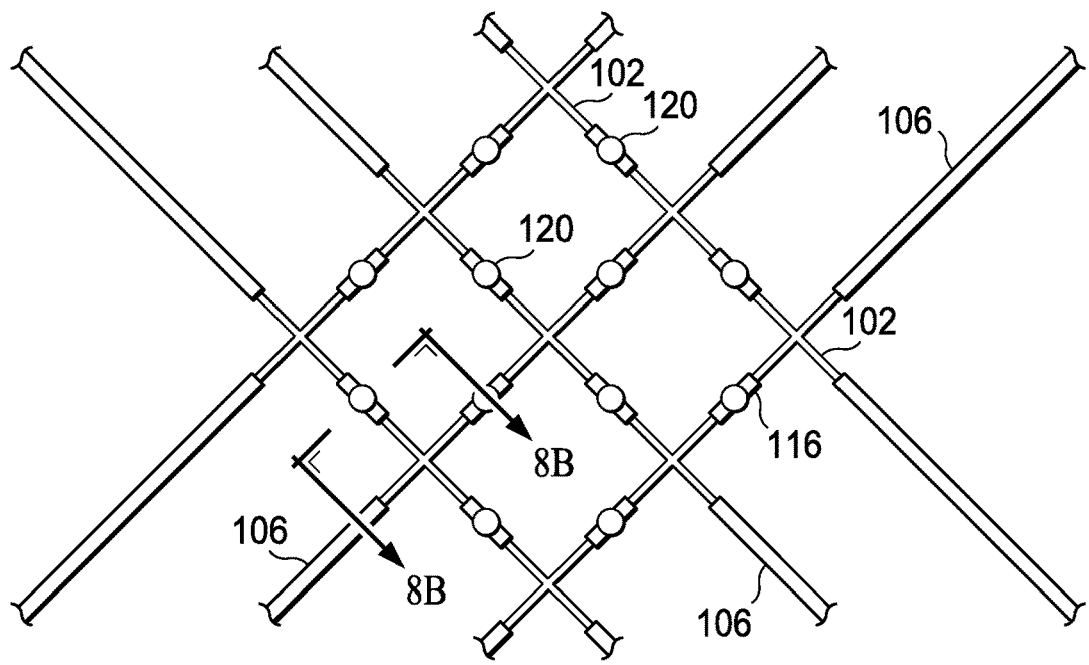
FIG. 8A is a 2D schematic representation of the graphene or graphene/polymer micro-lattice depicted in FIG. 7A with additional polymer applied around the gates.
Figure 8B:
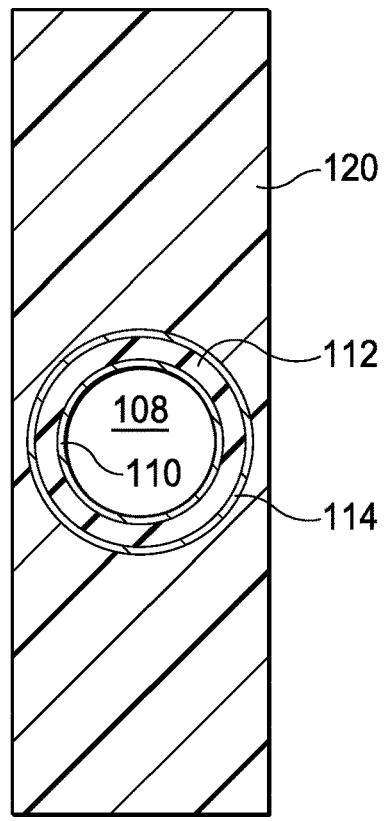
FIG. 8B is a cross-sectional view of the graphene or graphene/polymer micro-lattice shown in FIG. 8A taken along line 8B-8B.

FIG. 8 depicts the result of a third polymerization step wherein the micro-lattice is again immersed in monomer and beams of light slightly wider than the diameter of the gate are sent in to photo-initiate polymerization around the gates. A cross-sectional view of the gate surrounded by polymer is shown on the left of FIG. 8.

Figure 9A:
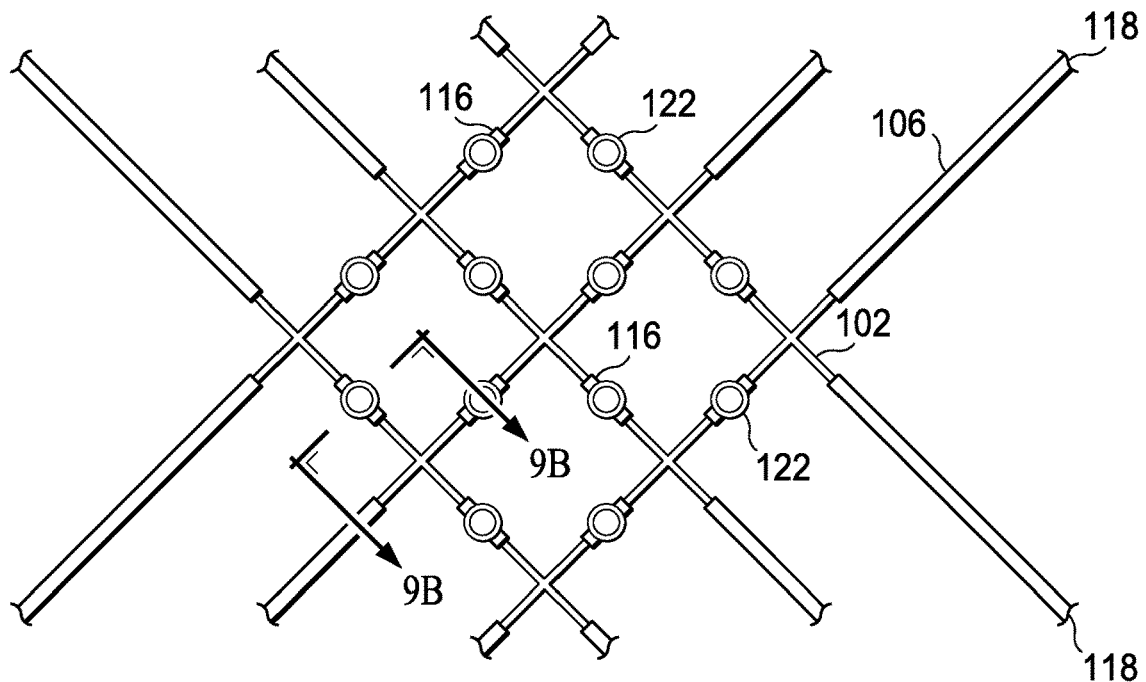
FIG. 9A is a 2D schematic representation of the graphene or graphene/polymer micro-lattice depicted in FIG. 8 with the additional polymer applied around the gates plated with metal.
Figure 9B:
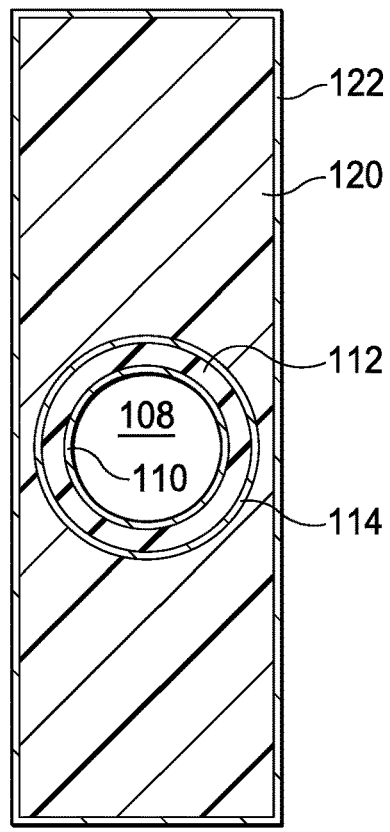
FIG. 9B is a cross-sectional view of the graphene or graphene/polymer micro-lattice shown in FIG. 9A taken along line 9B-9B.

In FIG. 9, the additional polymer applied around the gates is shown plated with metal 122. This is done so as to provide electrical connections to the gates. Alternatively, other electrical conductors (such as graphene, for example) could be used as the coating material.

FIGS. 10-15 show how certain gates in a six-unit-cell portion of micro-lattice switchable array 100 may be controlled. Gate connectors 132 may be routed through openings 128 in micro-lattice 100 to reach selected gates 130 from external surface 124 of the superlattice via external gate contacts 118'.

Figure 10:
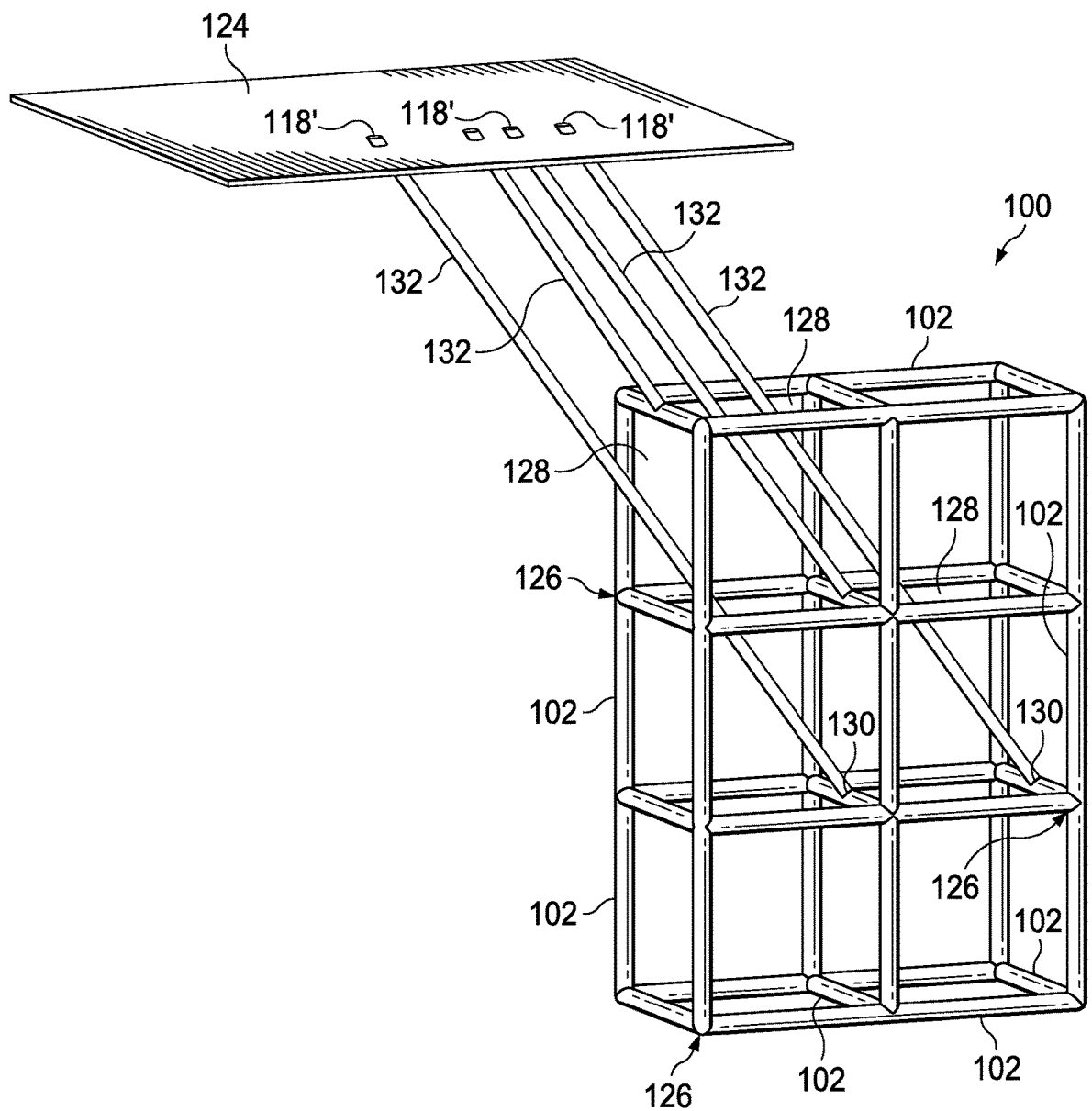
FIGS. 10, 11 and 12 are views from various angles of a 3D schematic representation of a graphene or graphene/polymer micro-lattice with connectors to gates on various horizontal lattice members.
Figure 11:
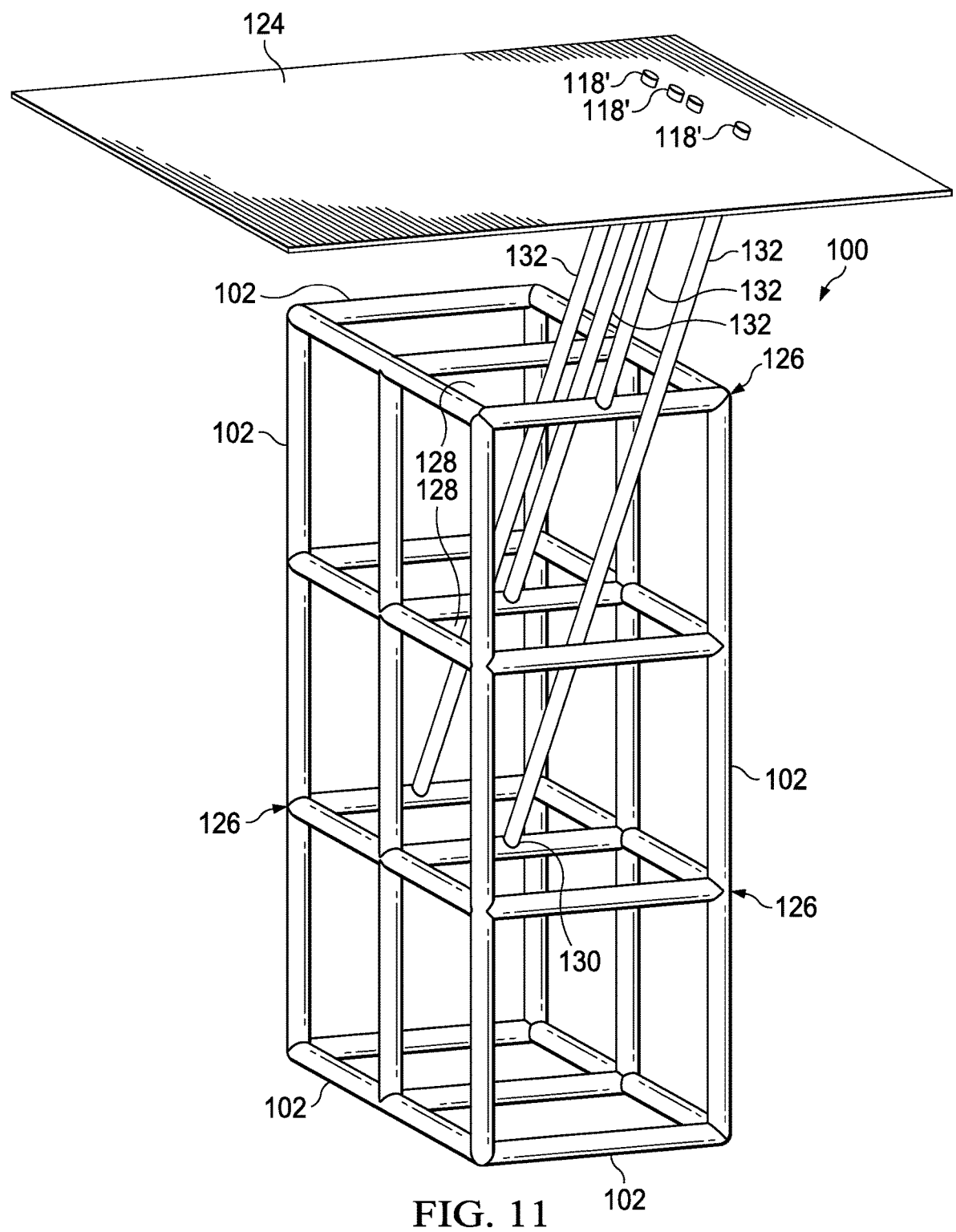
Figure 12:
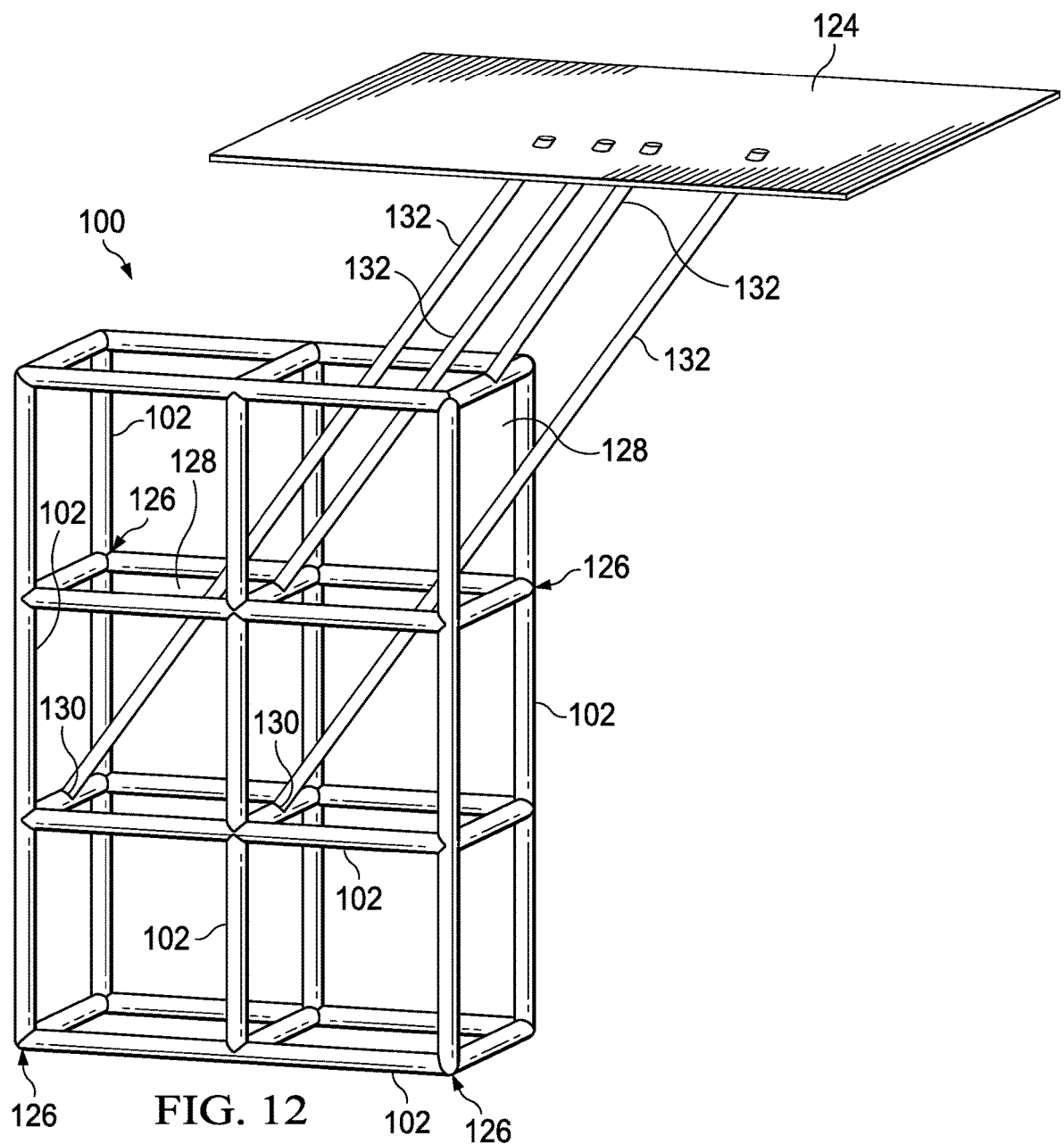
Figure 13:
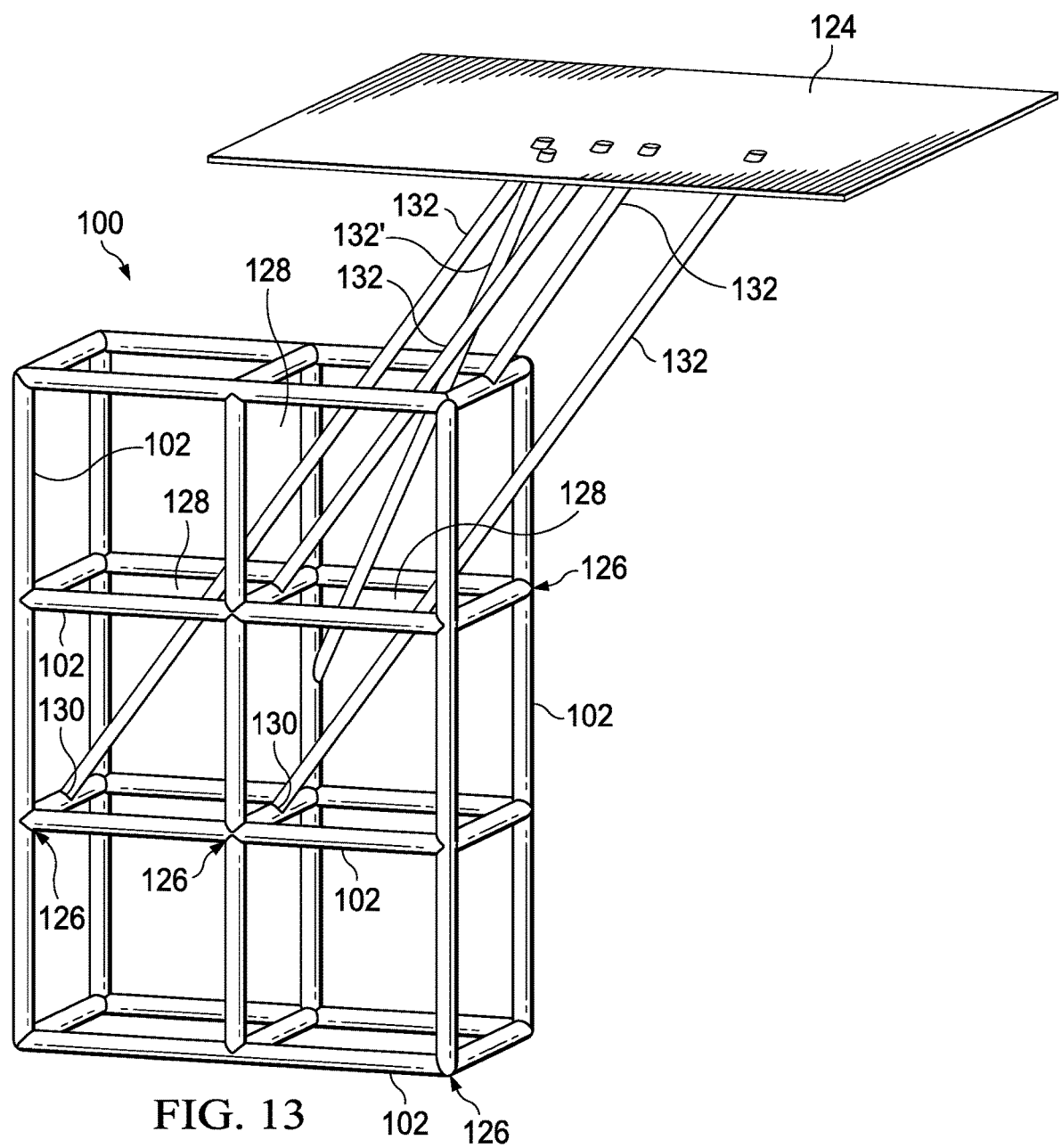
FIGS. 13, 14 and 15 are views from various angles of a 3D schematic representation of a graphene or graphene/polymer micro-lattice with connectors to gates on both horizontal and vertical lattice members.
Figure 14:
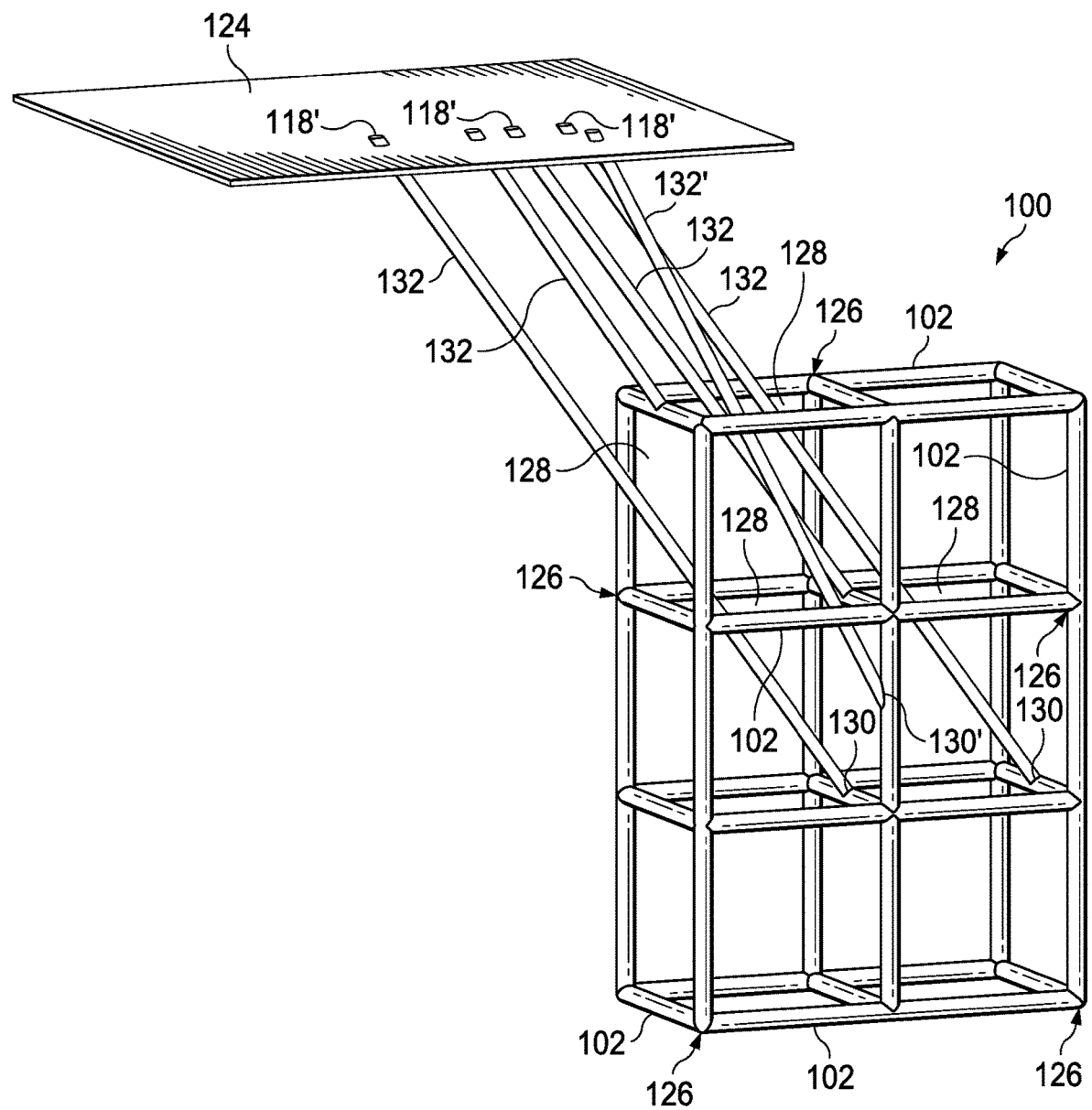
Figure 15:
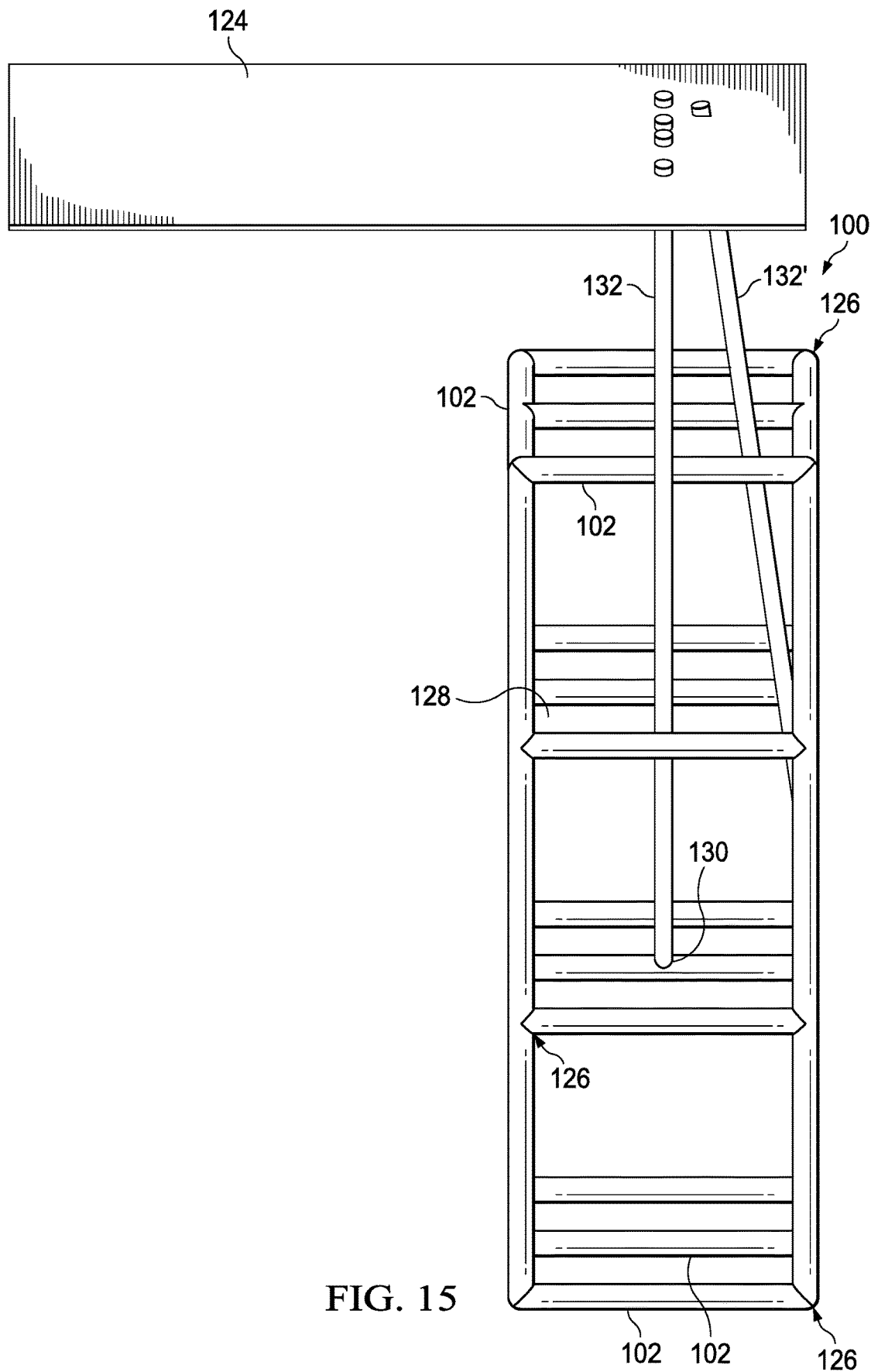

In FIGS. 10, 11, and 12, the gates 130 are all located in horizontal members of the lattice. In this situation, gate connectors 132 may be co-planar. FIGS. 13, 14, and 15 illustrate how a gate 130' in a vertical member of the lattice may be reached with a "skewed" gate connector 132' without interfering with other gate connectors 132 and lattice members.

Modifications are possible in the described embodiments, and other embodiments are possible, within the scope of the claims.

What is claimed is:

1. A switchable array comprising:
   a microstructure of interconnected units formed of graphene tubes with open spaces in the microstructure bounded by the graphene tubes;
   at least one JFET gate in at least one of the graphene tubes; and
   a control line having an end connected to the at least one JFET gate, the control line extending to a periphery of the microstructure.

2. The switchable array of claim 1, wherein the graphene tubes are arranged in an ordered structure and form symmetric patterns that repeat along principal directions of three-dimensional space.

3. The switchable array of claim 1, wherein the graphene tubes form a rigid structure.

4. The switchable array of claim 1, wherein the microstructure forms a micro-lattice.

5. The switchable array of claim 1, wherein the graphene tubes are hollow.

6. The switchable array of claim 1, wherein the graphene tubes are interconnected by chemical electronic bonds.

7. The switchable array of claim 1, wherein the control line passes through at least one open space bounded by the microstructure.

8. The switchable array of claim 7, wherein the control line passes through open spaces bounded by the microstructure.

9. The switchable array of claim 1, wherein the control line comprises a polymer plated with an electrically conductive metal.

10. A method of forming a switchable array graphene microstructure, the method comprising:
- photo-initiating polymerization of a monomer in a pattern of connected interconnected units to form a polymer micro-lattice;
- removing unpolymerized monomer;
- coating the polymer micro-lattice with a metal;
- removing the polymer micro-lattice to leave a metal micro-lattice;
- forming graphene on the metal micro-lattice;
- removing the metal micro-lattice to leave a graphene micro-lattice;
- photo-initiating polymerization of a monomer around connections in the graphene micro-lattice;
- removing unpolymerized monomer to leave a micro-lattice having portions of exposed graphene and portions of graphene surrounded by polymer;
- coating the portions of exposed graphene with dielectric and metal;
- selectively removing plating resist to leave gates in the micro-lattice;
- removing the polymer surrounding the connections in the graphene micro-lattice;
- photo-initiating polymerization of a monomer in columns extending from a gate through one or more openings in the micro-lattice to a periphery of the micro-lattice; and
- plating the columns with an electrically conductive metal to form gate control lines.

11. The method of claim 10, wherein the photo-initiating polymerization of the monomer in the pattern comprises passing collimated light through a photomask.

12. The method of claim 10, wherein the photo-initiating polymerization of the monomer in the pattern comprises multi-photon lithography.

13. The method of claim 10, wherein the coating the polymer micro-lattice with the metal comprises the electroless deposition of copper or nickel.

14. The method of claim 10, wherein the plating the columns with the electrically conductive metal comprises electroless deposition of copper or nickel.

15. The method of claim 10, wherein the polymer micro-lattice comprises polystyrene or poly(methyl methacrylate).

16. The method of claim 10, wherein the gates are junction field effect transistors.

17. A switchable array graphene microstructure prepared by a process comprising:
- photo-initiating polymerization of a monomer in a pattern of connected interconnected units to form a polymer micro-lattice;
- removing unpolymerized monomer;
- coating the polymer micro-lattice with a metal;
- removing the polymer micro-lattice to leave a metal micro-lattice;
- forming graphene on the metal micro-lattice;
- removing the metal micro-lattice to leave a graphene micro-lattice;
- photo-initiating polymerization of a monomer around connections in the graphene micro-lattice;
- removing unpolymerized monomer to leave a micro-lattice having portions of exposed graphene and portions of graphene surrounded by polymer;
- coating the portions of exposed graphene with dielectric and metal;
- selectively removing plating resist to leave gates in the micro-lattice;
- removing the polymer surrounding the connections in the graphene micro-lattice;
- photo-initiating polymerization of a monomer in columns extending from a gate through one or more openings in the micro-lattice to a periphery of the micro-lattice; and
- plating the columns with an electrically conductive metal to form gate control lines.

18. The switchable array graphene microstructure of claim 17, wherein the photo-initiating polymerization of the monomer in the pattern comprises passing collimated light through a photomask.

19. The switchable array graphene microstructure of claim 17, wherein the photo-initiating polymerization of the monomer in the pattern comprises multi-photon lithography.

20. The switchable array graphene microstructure of claim 17, wherein the coating the polymer micro-lattice with the metal comprises electroless deposition of copper or nickel.

* * * * *